(12) United States Patent
Hufford et al.

(10) Patent No.: US 7,634,038 B1
(45) Date of Patent: Dec. 15, 2009

(54) WIDEBAND PHASE-LOCKED LOOP WITH ADAPTIVE FREQUENCY RESPONSE THAT TRACKS A REFERENCE

(75) Inventors: Michael Hufford, Catonsville, MD (US); Eric Naviasky, Ellicott City, MD (US); Stephen Williams, Baltimore, MD (US); Michelle Williams, Laurel, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 696 days.

(21) Appl. No.: 11/339,077

(22) Filed: Jan. 24, 2006

(51) Int. Cl.
*H03D 3/24* (2006.01)
(52) U.S. Cl. .................. 375/376; 375/215; 375/294; 375/327; 375/362; 375/373; 375/374; 375/375
(58) Field of Classification Search ............... 375/376, 375/215, 294, 327, 373, 374, 375
See application file for complete search history.

(56) References Cited

U.S. PATENT DOCUMENTS

| | | | | |
|---|---|---|---|---|
| 5,128,632 A | * | 7/1992 | Erhart et al. ............ | 331/1 A |
| 5,426,384 A | * | 6/1995 | May ........................ | 327/52 |
| 2005/0264369 A1 | * | 12/2005 | Sowlati et al. .......... | 331/17 |
| 2007/0126514 A1 | * | 6/2007 | Lin et al. ................. | 331/16 |

* cited by examiner

*Primary Examiner*—Shuwang Liu
*Assistant Examiner*—Kabir A Timory
(74) *Attorney, Agent, or Firm*—McDermott Will & Emery LLP

(57) ABSTRACT

A self-tuning $3^{rd}$ order type III phase-locked loop (PLL) is disclosed. In one aspect, the PLL provides frequency control that is implemented in three (3) parallel paths. The PLL provides frequency response tracking using a number of elements including a triple control voltage-controlled oscillator (VCO), a frequency-to-current (F2I) converter, and a switched capacitor loop filter. In addition to compensation for feedback ratio variation, near constant F2I gain over process variations and switched capacitor filters synchronized to a reference signal, near constant VCO gain over process variations allows the open loop frequency response to be tailored to track the reference signal. A high-speed locking technique is employed which significantly reduces acquisition time in low bandwidth cases. This PLL may be fabricated in a 0.18 μm CMOS logic process.

25 Claims, 11 Drawing Sheets

US 7,634,038 B1

WIDEBAND PHASE-LOCKED LOOP WITH ADAPTIVE FREQUENCY RESPONSE THAT TRACKS A REFERENCE

CROSS-REFERENCE(S) TO RELATED APPLICATION(S)

Not Applicable.

STATEMENT AS TO RIGHTS TO INVENTIONS MADE UNDER FEDERALLY SPONSORED RESEARCH OR DEVELOPMENT

Not Applicable.

BACKGROUND OF THE INVENTION

The present invention generally relates to phase-locked loops (PLLs) and, in particular, to an improved wideband phase-locked loop with adaptive frequency response.

FIG. 1 illustrates a conventional PLL. As shown in FIG. 1, the conventional $3^{rd}$ order type II PLL architecture includes a phase-frequency detector (PFD), a charge pump (CP), a $2^{nd}$ order loop filter, a voltage-controlled oscillator (VCO), and a feedback divider.

The gain of the PFD and CP ($K_{PFD}$) is proportional to the charge pump maximum output current $I_{CP}$. $K_{VCO}$ is the voltage-to-frequency gain of the VCO in units of Hz/V. The feedback divider has a gain of 1/M, where M is the modulus of the divider. This results in an open loop gain equation given by Equation (1).

$$H(j\omega) = \frac{(j\omega \cdot \tau_1 + 1) \cdot K_{VCO} \cdot I_{CP}}{(j\omega)^2 \cdot (j\omega \cdot \tau_2 + 1) \cdot (C_1 + C_2) \cdot M} \quad \text{Eq. (1)}$$

where: $\tau_1 = R_1 \cdot C_1$; $\tau_2 = \tau_1 \cdot C_2/(C_1+C_2)$

Trying to design the blocks of the PLL to automatically handle a wide reference frequency range may present many problems. For example, one disadvantage of the foregoing architecture as shown in FIG. 1 is that when the reference signal changes, some aspect of the loop needs to change with the reference signal in order to shift not just the bandwidth but the stabilizing corners as well. Another disadvantage of this architecture is that in order to span a wide range of VCO frequencies ($F_{VCO}$), $K_{VCO}$ needs to be large due to a limited control voltage range. However, a large $K_{VCO}$ forces the dominant pole capacitor to increase and the charge pump current to decrease, thereby increasing the PLL's sensitivity to charge pump noise, loop filter noise, and ripple caused by charge pump mismatches. Furthermore, in order to handle a wide range of M, the charge pump current is usually made programmable with M.

Self-tuning wideband PLL's have been generally known in the industry. In one prior art system, the self-biased PLL manipulates the charge pump gain by a modest switch network that adjusts the current gain by 1/M. However, a drawback of this approach is the complexity introduced by an additional feedback loop to compensate for $K_{VCO}$ which requires special attention with respect to stability and start-up conditions.

In another prior art system, the PLL incorporates a sampled proportion and integral path control. This PLL, however, utilizes a complicated method of frequency tracking that employs programming the proportional path gm and C as a function of input divider value N. This PLL also requires the programming of the integral path C as a function of M.

Hence, it would be desirable to provide an improved wideband PLL that is capable of, amongst other things, avoiding the disadvantages of prior art systems as described above.

SUMMARY OF THE INVENTION

A system for providing a wideband phase-locked loop is disclosed. In one embodiment, the system comprises a phase-frequency detector, a frequency-to-current converter, a charge pump, a loop filter and a voltage controlled oscillator. The phase-frequency detector is configured to generate an up signal and a down signal. The frequency-to-current converter is configured to receive a reference signal and generate a number of control signals. The charge pump is configured to receive the up and down signals from the phase-frequency detector and a control signal from the frequency-to-current converter, and generate a first output signal and a second output signal. The loop filter configured to receive the first and second output signals from the charge pump, and generate a proportional path signal, an integral path signal and a $2^{nd}$ integral path signal. The voltage controlled oscillator is configured to generate an output signal based on the proportional path signal, the integral path signal and the $2^{nd}$ integral path signal. The output signal from the voltage controlled oscillator is fed back to the phase-frequency detector.

A method of implementing a phase-locked loop is disclosed. In one embodiment, a frequency-to-current conversion is performed based on a reference signal to generate a control signal. The control signal is then used to direct a charge pump to generate a first output signal and a second output signal. Next, the first and second output signals from the charge pump are used to direct a loop filter to generate a proportional path signal, an integral path signal, and a $2^{nd}$ integral path signal. Finally, the proportional path signal, the integral path signal and the $2^{nd}$ integral path signal are used to direct a voltage controlled oscillator to generate an output signal.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings, like reference numbers indicate identical or functionally similar elements.

BRIEF DESCRIPTION OF THE DRAWINGS

Aspects, advantages and novel features of the present invention will become apparent from the following description of the invention presented in conjunction with the accompanying drawings.

DETAILED DESCRIPTION OF SPECIFIC EMBODIMENTS

Figure 1:
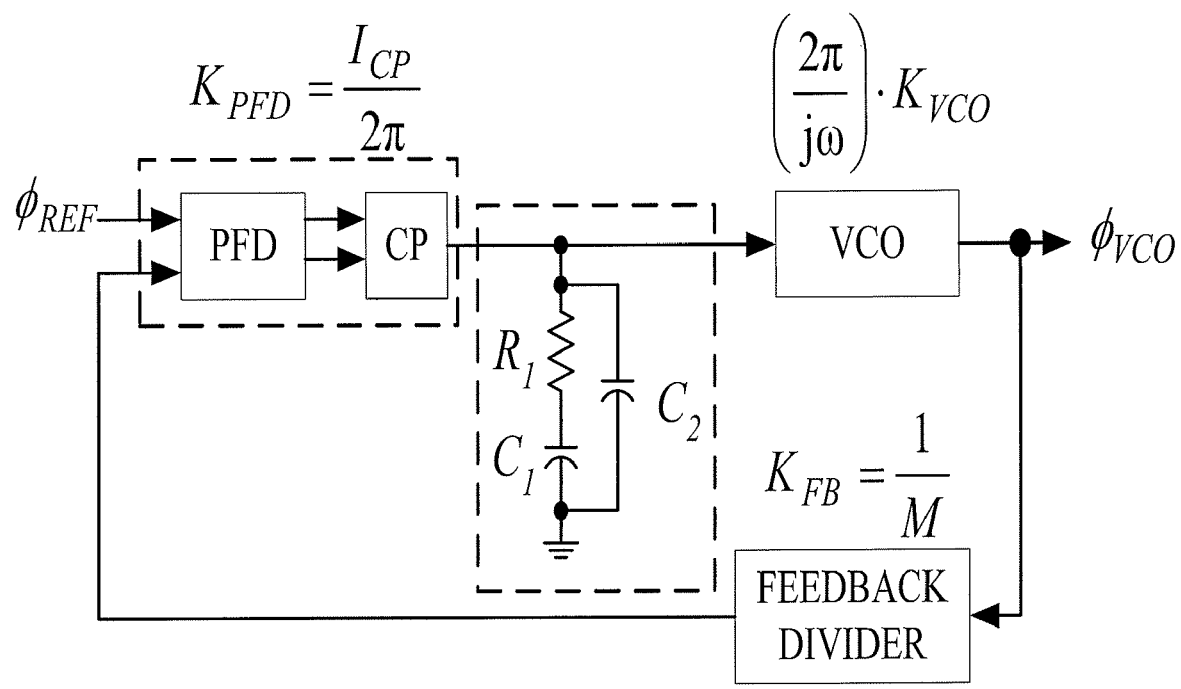
FIG. 1 is a simplified schematic diagram illustrating a conventional 3rd order PLL architecture.
Figure 2:
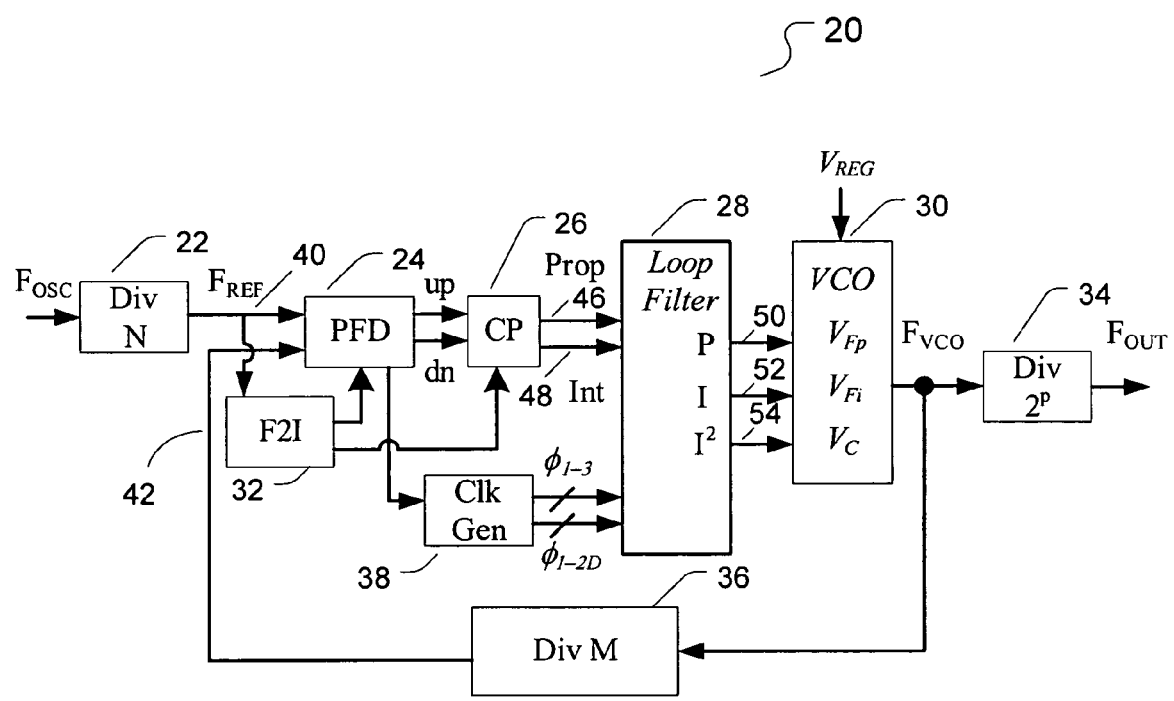
FIG. 2 is a simplified schematic diagram illustrating one embodiment of a PLL architecture according to the present invention.

One or more embodiments of the present invention will now be described. FIG. 2 illustrates one embodiment of the PLL according to the present invention. As shown in FIG. 2, architecture of the PLL 20 includes an input divider 22, a phase-frequency detector (PFD) 24, a charge pump 26, a loop filter 28, a voltage-controlled oscillator (VCO) 30, a frequency-to-current (F2I) converter 32, an output divider 34, a feedback divider 36 and a clock generator 38, the respective operations of which will be further described below.

The PLL 20 uses three (3) control paths of different bandwidths. The three (3) control paths include a proportional path, an integral path and a $2^{nd}$ integral path, as represented by P, I and $I^2$ (50, 52, 54 respectively) in FIG. 2. The PLL 20 is implemented with a proportion, integral and $2^{nd}$ integral of the net charge representation of the phase error between the reference clock signal 40 and the feedback clock signal 42.

Figure 3:
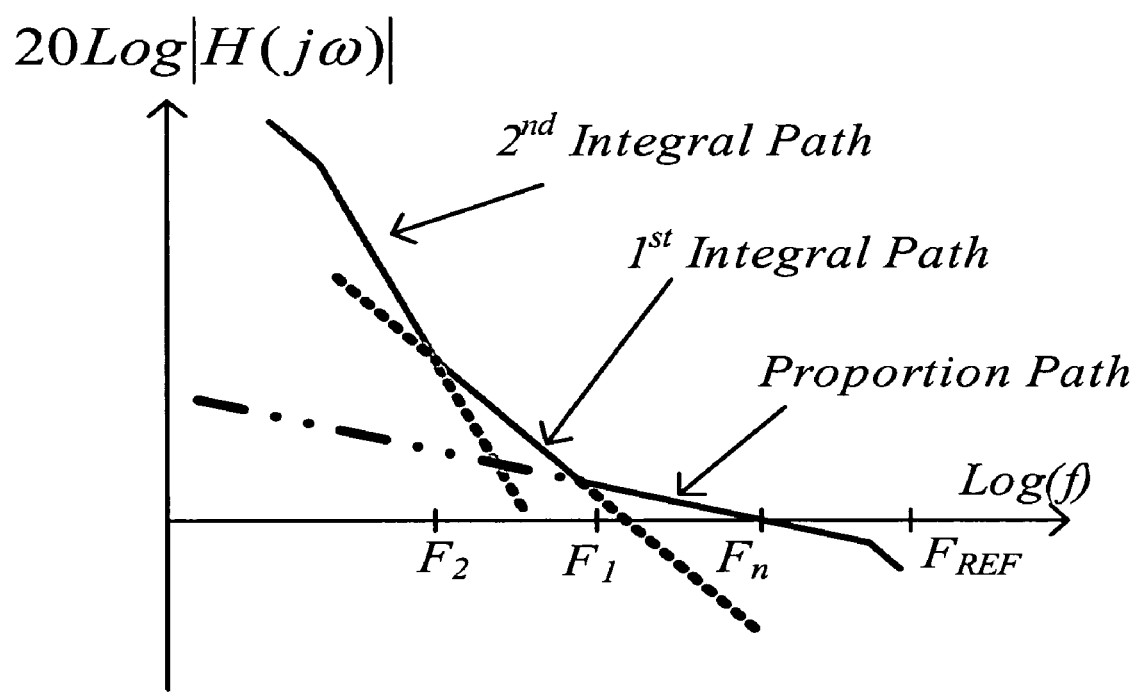
FIG. 3 is a Bode plot of the open loop transfer function of the PLL architecture shown in FIG. 2.

The open loop Bode diagram is constructed from the superposition of the frequency response of the individual paths and is shown in FIG. 3. By having three (3) separate paths, the frequency characteristics can be tailored by controlling the gain on the individual paths.

The proportional path gain sets the loop bandwidth. The integral path gain sets the stabilizing zero which controls phase margin. The $2^{nd}$ integral path gain is made sufficiently low to make sure it is out of the way of influencing stability. Using switched capacitor samplers and integrators allows all path gains to be automatically adjusted relative to the reference frequency $F_{REF}$. The $2^{nd}$ integral path also sets the average VCO frequency and allows negligible loop gain artifacts that are not controllable to be made.

Figure 4:
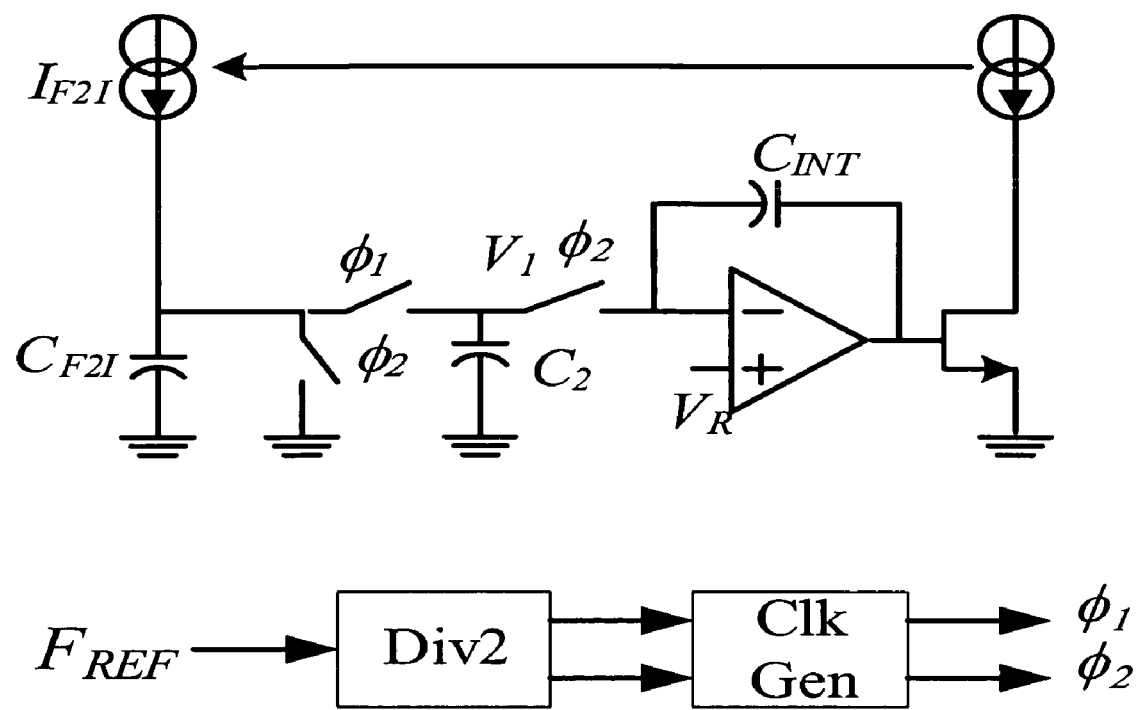
FIG. 4 is a simplified schematic diagram illustrating one embodiment of a frequency-to-current converter according to the present invention.

One embodiment of the F2I converter 32 is shown in FIG. 4. The F2I converter 32 is used to supply the charge pump current reference. The F2I converter 32 uses non-overlapping clock phases ($\phi_1$ and $\phi_2$) generated from the reference signal 40 divided by two (2). This guarantees 50% duty in generating these clock phases. During $\phi_1$, capacitors $C_{F2I}$ and $C_2$ ramp up to voltage $V_1$. During $\phi_2$, capacitor $C_{F2I}$ is reset and capacitor $C_2$ is switched to the integrating amplifier 44 leaving the voltage on capacitor $C_2$ at $V_R$. Going back to $\phi_1$, the charge on $C_2$ is redistributed giving an initial voltage on $C_2+C_{F2I}$ of $V_1=V_R C_2/(C_2+C_{F2I})$.

The loop adjusts the charging current to make the final charging voltage $V_1=V_R$. It can be shown that the resulting current is proportional to the reference frequency $F_{REF}$ and $C_{F2I}$ as follows: $I_{F2I}=V_R \cdot C_{F2I} \cdot F_{REF}$.

In one embodiment, the charge pump 26 is a simple switched mirror type that has separate outputs for proportion and integral paths, "prop" 46 and "int" 48. The charge pump 26 generates such outputs depending on a control signal received from the F2I converter 32.

In one embodiment, the PFD 24 is based on the standard tri-state design with a modification to allow for an additional output that is a slight delay from the reset pulse and is used to generate the three phases of non-overlapping clock signals for the loop filter 28.

Different types of VCOs may be used for the PLL 20 as shown in FIG. 2. In one embodiment, the VCO 30 is a ring oscillator type VCO; in an alternative embodiment, the VCO 30 is a relaxation oscillator type VCO; in a third embodiment, the VCO 30 is an LC oscillator type VCO. Regardless of which type of VCOs is used, the VCO 30 is designed for handling three (3) control inputs. Two inputs, prop and int, 46 and 48, are for fine tune control using varactors and have the gain relationship (or transfer characteristics) as shown in Equation (2):

$$\frac{K_{VF}}{M} \cong 2\pi \frac{\left(\left(1+\frac{C_{VMAC}}{C_L}\right) \cdot C_{VMAX} \cdot F_{REF}\right)}{(V_{FINEMAX}-V_{FINEMIN})} \quad \text{Eq. (2)}$$

Equation (2) reduces to:

$$K_{VF} \cong 2\pi M \cdot F_{REF} \cdot K_{VV} \quad \text{Eq. (3)}$$

$$\text{Where } K_{VV} = \frac{\left(\left(1+\frac{C_{VMAX}}{C_L}\right) \cdot C_{VMAX}\right)}{(V_{FINEMAX}-V_{FINEMIN})} \quad \text{Eq. (4)}$$

Note that $K_{VV}$ is a term that is well controlled over process corners and that $K_{VF}/M$ is approximately constant for changing values of M and fixed $F_{REF}$. VCO 28 may operate from 2.5 MHz to over 1 GHz.

The coarse path voltage controls a current which sets the average frequency. This gain is typically represented as $2\pi K_{VC}$ which contains any gm and process, voltage, temperature (PVT) contributors. The total amount of variation in $K_{VC}$ can be anywhere from 2:1 to 5:1 over corners. As will be shown further below, the $K_{VC}$ variation has a negligible impact on PLL bandwidth and phase margin.

Figure 5:
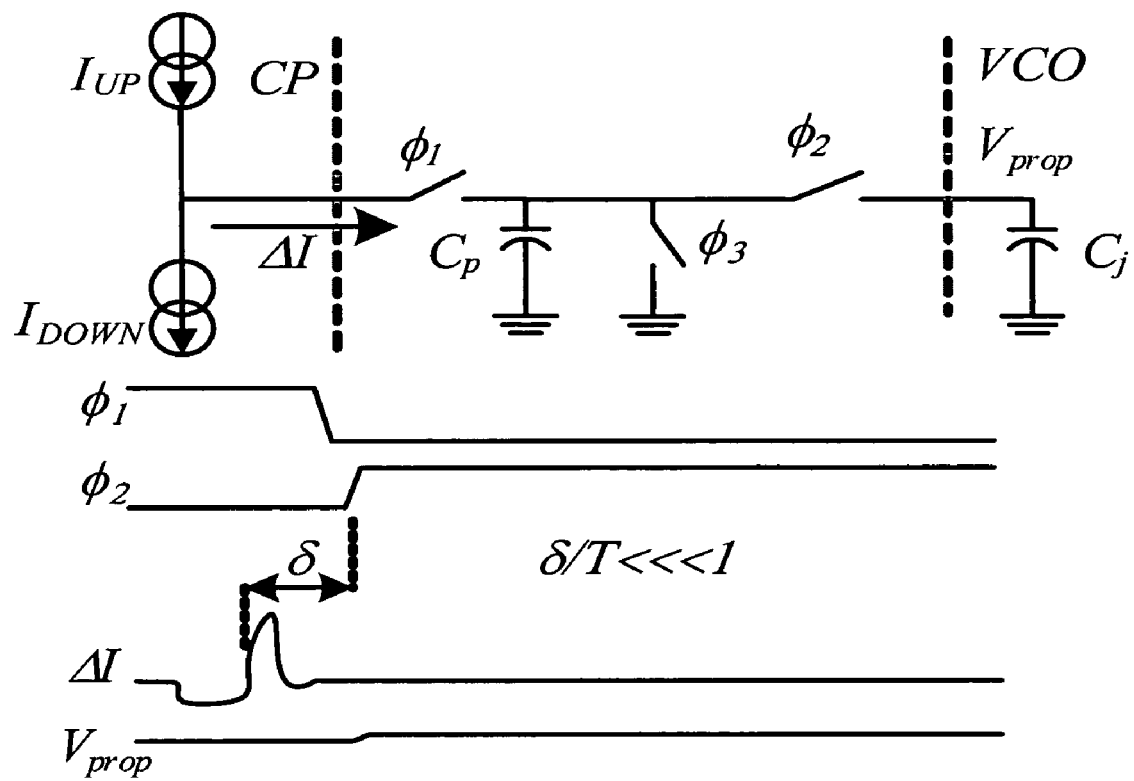
FIG. 5 is a simplified schematic diagram illustrating one embodiment of a proportional path SC sampler according to the present invention.

The loop filter 28 includes a proportional path filter as shown in FIG. 5. The proportional path filter has three (3) paths and is controlled using three (3) phases of non-overlapping clocks to drive both the proportional path and the integral path. In one embodiment, the proportional path filter is an N-path sampler with combined transfer function following simplification for low frequencies as shown in Equation (5):

$$Hp(j\omega) = \frac{1}{C_p \cdot F_{REF}} \quad \text{Eq. (5)}$$

Notice that the proportional path filter behaves like a frequency dependent resistor which decreases as the reference frequency $F_{REF}$ increases, resulting in a constant gain vs. reference frequency. Conversely, as the reference frequency $F_{REF}$ increases, the charge pump current similarly increases. Because the net charge is transferred as a step as opposed to direct tracking of the phase error, a smaller perturbation on the control voltage will result thereby reducing reference spur levels. During $\phi_2$, the proportional path filter outputs signal $V_{prop}$ to the VCO 30; the signal $V_{prop}$ is represented as "P" 50 in FIG. 2.

Figure 6:
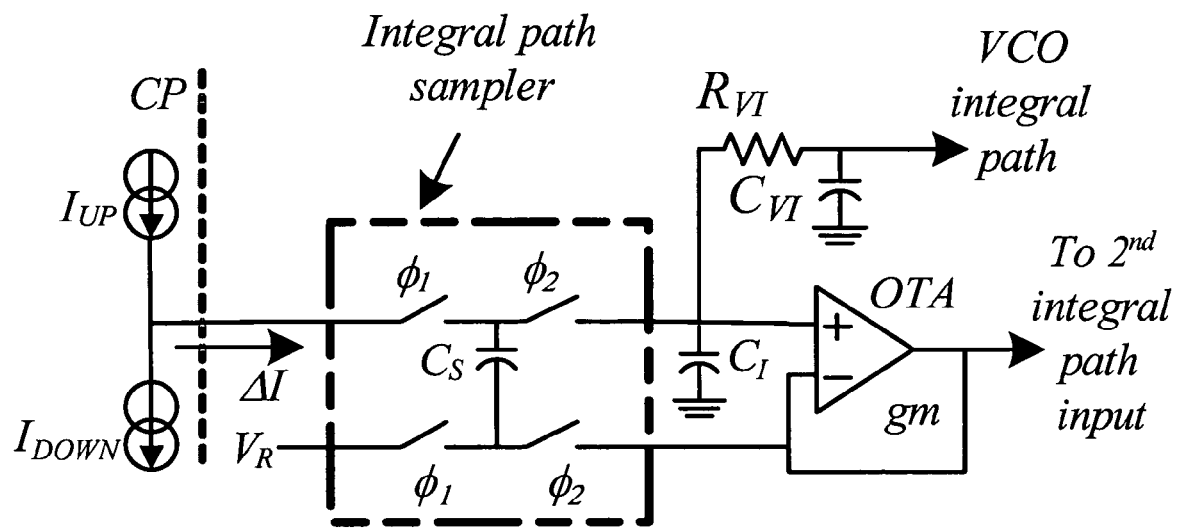
FIG. 6 is a simplified schematic diagram illustrating one embodiment of an integral path SC integrator according to the present invention.

The loop filter 28 further includes an integral path filter as shown in FIG. 6. In one embodiment, the integral path filter is a switched capacitor integrator. Here $R_{VI}$ and $C_{VI}$ serve mainly to suppress switch transients and its corner is far removed from influencing stability. Since the flying capacitor sampler is to hold a positive as well as negative charge, a metal capacitor is used for $C_S$. Optionally, $C_{VI}$ could be made small relative to $C_I$. In a similar manner as was done for Equation (5), it is found that for low frequencies and cases where $C_{VI}<<C_I$, the transfer characteristics for the integral path is as follows:

$$H_I(j\omega) = \frac{1}{j\omega C_1} \qquad \text{Eq. (6)}$$

Notice that Equation (6) represents a current integrating capacitor which when compared to Equation (5) will intersect each other at a frequency proportional to $F_{REF}$. As shown in FIG. 6, the $R_{VI}$ and $C_{VI}$ circuit outputs a signal along the integral path to the VCO 30; this same signal is represented as "I" 52 in FIG. 2.

Figure 7:
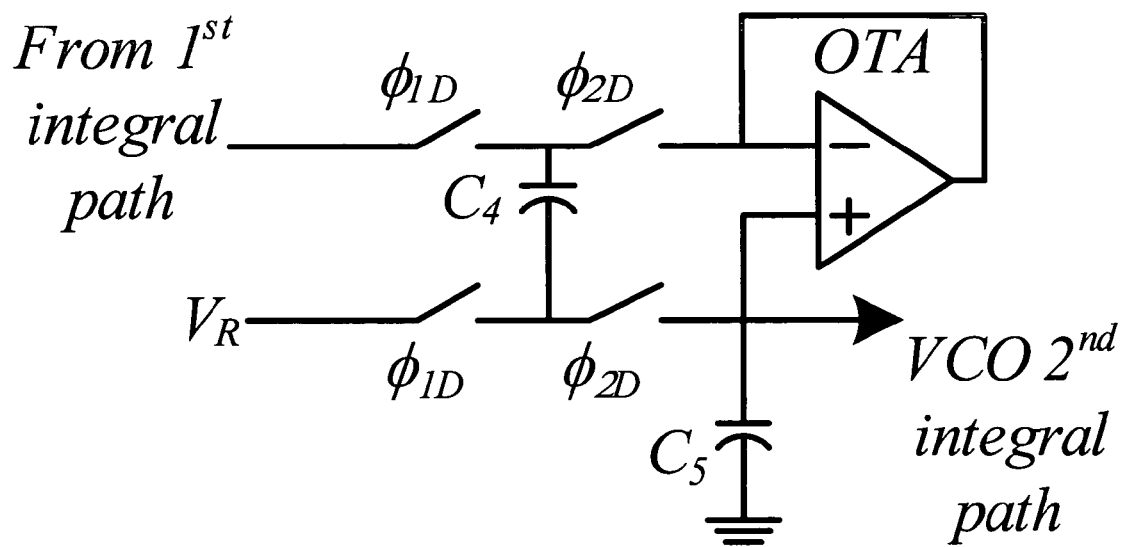
FIG. 7 is a simplified schematic diagram illustrating one embodiment of a 2nd integral path SC integrator according to the present invention.

As shown in FIG. 7, the $2^{nd}$ integration operates on the buffered capacitor output of the first integral path from FIG. 6. As shown in FIG. 6, the output from the amplifier OTA is forwarded to the circuit shown in FIG. 7. FIG. 7 illustrates a $2^{nd}$ integral path represented by a switched capacitor integrator. The switched capacitor integrator outputs a signal along the 2nd integral path to the VCO 30; this same signal is represented as "$I^2$" 54 in FIG. 2. This switched capacitor integrator is controlled using a self-setting decimation of the reference clock by a factor of D. It can be shown that its transfer function for very low frequencies of interest reduces to Equation (7) as follows:

$$H_{I2}(j\omega) = \frac{1}{C_I} \cdot \frac{F_{REF}}{(j\omega)^2 D} \cdot \frac{C_4}{C_5} \qquad \text{Eq. (7)}$$

Notice the effect decimation and reference frequency $F_{REF}$ have on the gain of the $2^{nd}$ integral path. Both of these factors will keep the variation of $K_{VC}$ from impacting the loop bandwidth and phase margin. The maximum value of D will be limited by the leakage of devices connected to $C_5$.

In order to remove the difference in gain variation between $K_{VC}$ and $K_{VF}$ in the $2^{nd}$ integral path, a decimation factor D is introduced to pull this path gain down as far as necessary to achieve stable operation which would allow the loop to lock. This is accomplished by sensing the limit cycle oscillations across a threshold set by a hysteresis comparator during acquisition. At the start of acquisition, the decimation is set at 2 to initiate high speed charging of the coarse capacitor $C_5$. If the situation occurs where stability is compromised, then the proportion level will overshoot either positively or negatively and the comparator will signal the decimator to increase by a factor of two (2). The loop, in the mean time, tries to turn around and the proportion level then overshoots negatively; the decimator again is flagged to bump decimation by another factor of two (2). Each time the decimator increases by two (2), the gain of the $2^{nd}$ integral path is decreased by two (2) and the zero moves lower in frequency. Usually in three (3) or four (4) decimator changes, the zero is sufficiently low enough that the integral and proportional paths take over and the coarse capacitor is near the final value. This locking technique significantly reduces acquisition time in low bandwidth cases.

In one embodiment, three counters are used in the PLL architecture 20. First, a 9-bit reference divider that allows for a divide by 1 pass-through giving DIV (N+1). Second, a 15-bit feedback counter with a minimum of divide by 2 giving DIV (M+2). Third, a 3-bit post divider that divides in powers of 2 to give 50% duty cycle on any of the settings giving DIV $2^P$. All of the counters are synthesized using standard cells in the process.

In one embodiment, the following component values may be used: $C_{F2I}=5p$, $C_P=0.5p$, $C_I=8p$, $C_4=0.5p$, $C_5=80p$, $K=K_{VV}V_R$, where for this process $V_R=0.81v$ and $K_{VV}=0.078/v$. In its simplest form using Equations (1), (3), (5), (6) and (7), the open loop transfer function can be written as Equations (8) and (9) as follows:

$$H_{OL}(s) = \frac{\omega_n}{s} + \frac{\omega_n \omega_1}{s^2} + \frac{\omega_n \omega_1 \omega_2}{s^3} \qquad \text{Eq. (8)}$$

$$H_{OL}(s) = \frac{\omega_n}{s}\left[1 + \frac{\omega_1}{s}\left(1 + \frac{\omega_2}{s}\right)\right] \qquad \text{Eq. (9)}$$

where each of the corners relative to the reference evaluates to $$\frac{\omega_n}{\omega_{REF}} = K \frac{C_{F2I}}{2\pi C_P} \approx \frac{1}{10} \qquad \text{Eq. (10)}$$

$$\frac{\omega_1}{\omega_{REF}} = \frac{C_P}{2\pi C_I} \approx \frac{1}{100} \qquad \text{Eq. (11)}$$

$$\frac{\omega_2}{\omega_{REF}} = \frac{C_4}{2\pi C_5} \frac{K_{VC}}{DK_{VF}} \leq \frac{1}{1000} \text{(Desired)} \qquad \text{Eq. (12)}$$

which gives $$D \geq \frac{K_{VC}}{K_{VF}} = 12.75 \frac{K_{VC}}{MF_{REF}} \qquad \text{Eq. (13)}$$

In this form and the definitions given, it is clear the near constant relationship between the reference input and the unity gain bandwidth Eq. (10) and the stabilizing zero Eq. (11) renders the PLL architecture 20 a self-tuning design. In one aspect, the tuning range of the divided reference for this PLL architecture 20 is from 30 KHz to 100 MHz.

The present invention provides a number of benefits and/or advantages. One advantage to the PLL architecture 20 is that the design of the charge pump 26 is simpler. In the standard PLL architecture, the charge pump needs a wide output voltage compliance range to be able to lock to a wide range of frequencies. This can cause charge pump offset and result in reference spurs on the output of the VCO. Under the PLL architecture 20, the loop will servo both charge pump outputs to operate near $V_{REF}$ under locked conditions. This allows the charge pump output to be set to a known voltage during locked conditions. Output voltage compliance constraints are moved to the $2^{nd}$ integral stage which can be easily designed to swing rail to rail.

Figure 8:
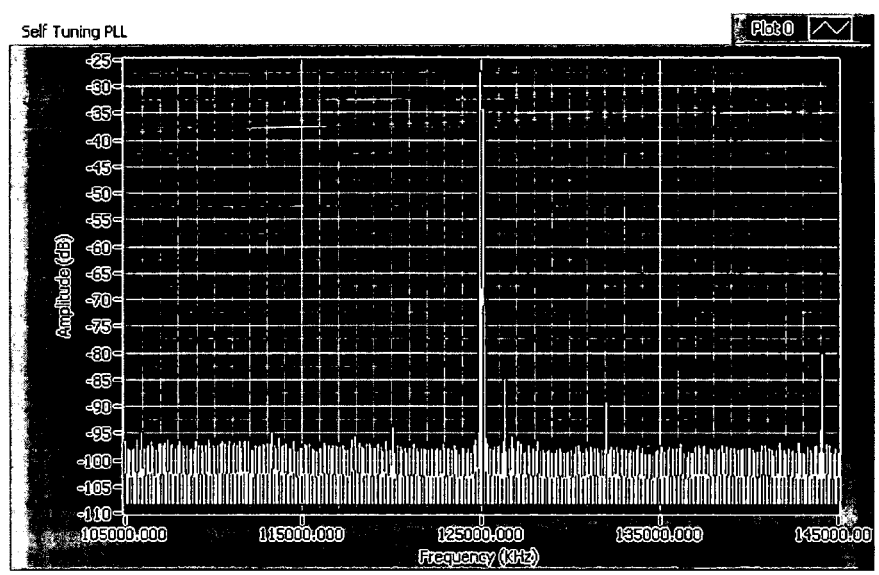
FIGS. 8-9 are respective plots showing output spectrum of the PLL architecture as shown in FIG. 2 under various conditions.

The following describes certain measurement results with respect to the PLL architecture 20. Due to test set limitations, the PLL architecture 20 is first set up to generate a frequency of 125 MHz. Here the reference frequency is set to a relatively high value with the pre-divider set to unity. The VCO is set to operate at around 500 MHz and then post divide to be able to port the signal off the test board to the spectrum analyzer. FIG. 8 shows the output spectrum of the PLL architecture 20 under the foregoing conditions.

Figure 9:
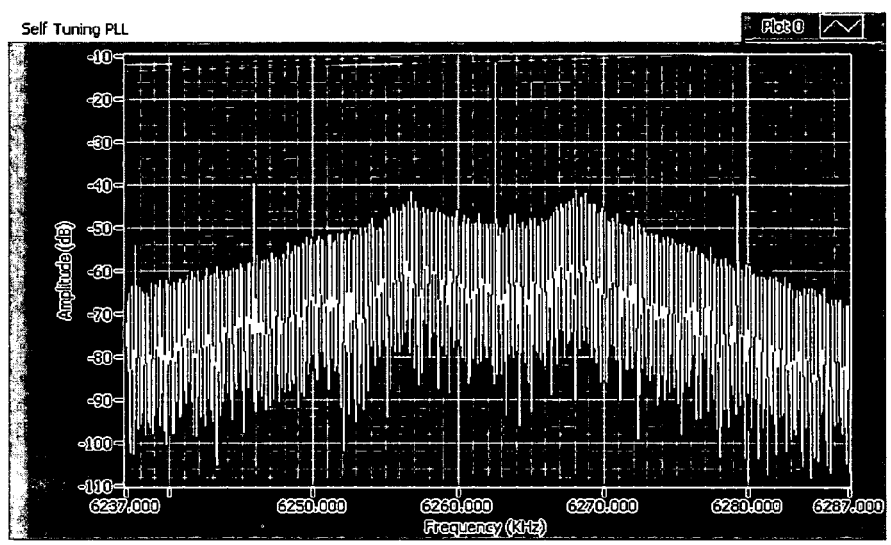

Next, the PLL architecture 20 is set to operate from a relatively low reference frequency of 50 KHz by cranking up the pre-divide. The VCO is set to operate at around 12.5 MHz and the feedback counter is adjusted accordingly. FIG. 9 shows the output spectrum of the PLL architecture 20 under the foregoing conditions. As can be seen, this demonstrates a 5000:1 loop frequency response tuning range.

Figure 10:
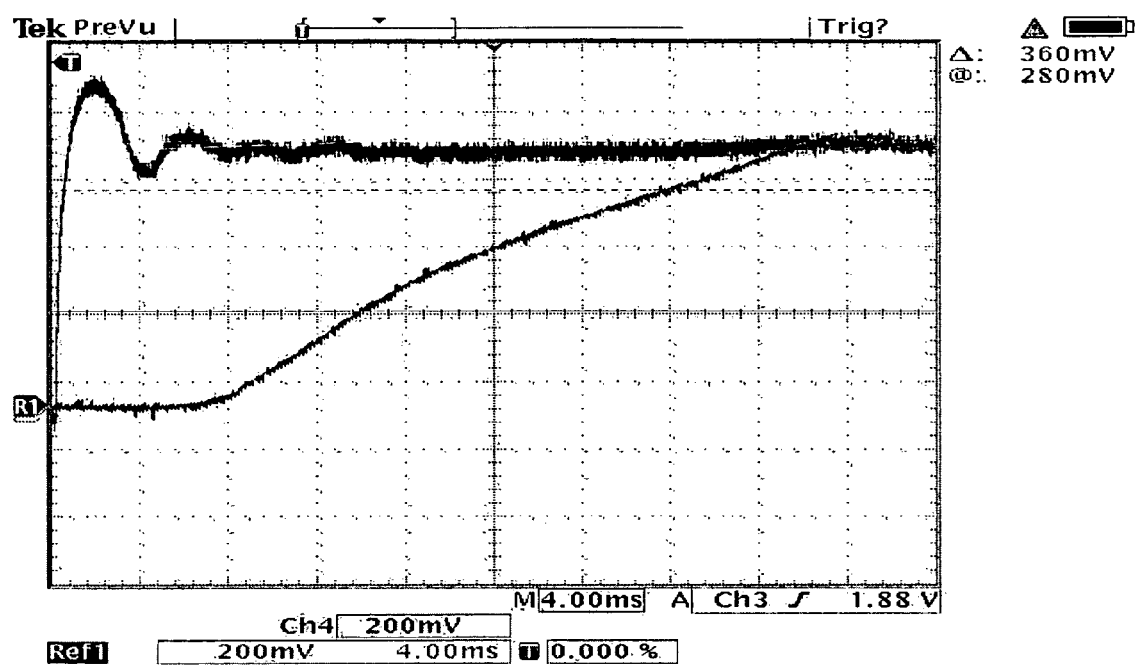
FIG. 10 is a plot showing the 2nd integral path on a coarse capacitor during acquisition of a low bandwidth setting according to one aspect of the present invention.

The PLL architecture 20 is designed with an Analog Test Bus (ATB) which allows monitor and control certain features of the PLL architecture 20 to be monitored and controlled. FIG. 10 shows the $2^{nd}$ integral path on the coarse capacitor during acquisition of a low bandwidth setting. As the coarse control voltage rings in, it can be seen that the slope of approach decreases at each pass indicating that the $2^{nd}$ integral gain and therefore the low frequency corner is moving lower to allow acquisition. This is compared with normal settling with decimator at its final value.

Figure 11:
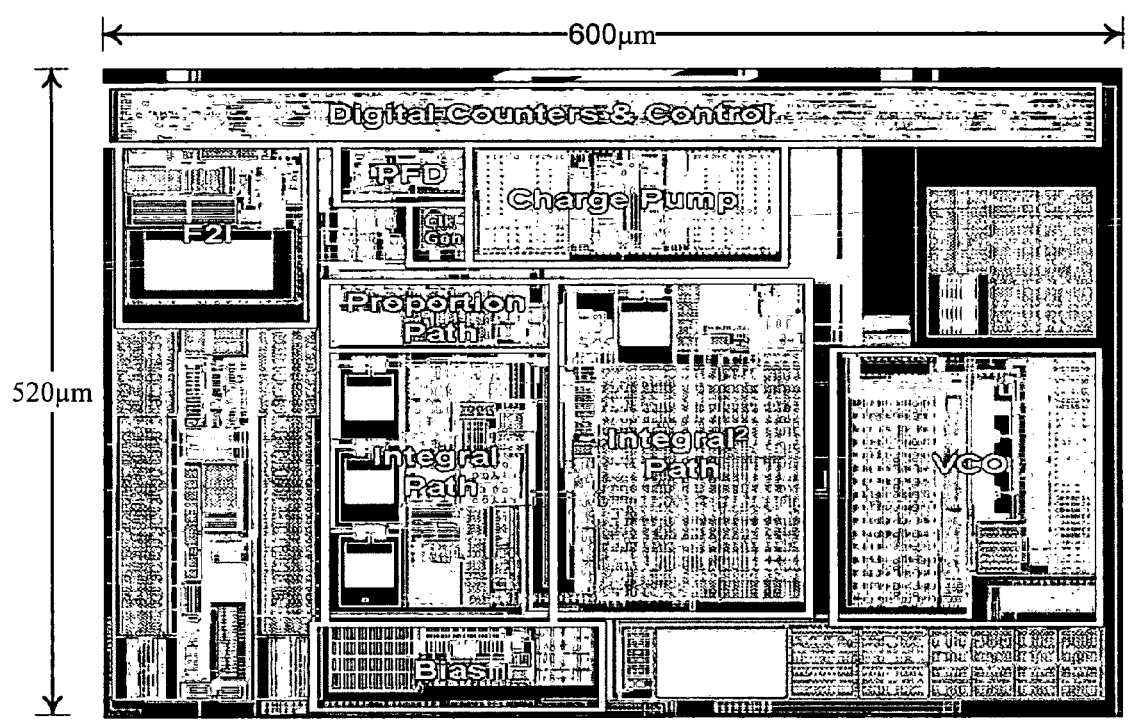
FIG. 11 is a plot illustrating the dimensions and component placement of the PLL architecture as shown in FIG. 2 according to one embodiment of the present invention.

In one embodiment, the PLL architecture 20 is fabricated in 0.18 um process and a illustrative plot is shown in FIG. 11.

The previous description of the disclosed embodiments is provided for purposes of illustration and description to enable any person skilled in the art to make or use the present invention. It is not intended to be exhaustive or to limit the invention to the precise form disclosed. Various modifications to these embodiments will be readily apparent to those skilled in the art, and the generic principles defined herein may be applied to other embodiments without departing from the spirit of scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

What is claimed is:

1. A system for providing a wideband phase-locked loop, comprising:
   a phase-frequency detector configured to generate an up signal and a down signal;
   a frequency-to-current converter configured to receive a reference signal and generate a plurality of control signals;
   a charge pump configured to:
     receive the up and down signals from the phase-frequency detector and one of the plurality of control signals from the frequency-to-current converter; and
     generate a first output signal and a second output signal;
   a loop filter configured to:
     receive the first and second output signals from the charge pump; and
     generate a proportional path signal to set a loop bandwidth, a $1^{st}$ integral path signal to set a stabilizing zero that controls a phase margin, and a $2^{nd}$ integral path signal to set an average voltage-controlled oscillator frequency; and
   a voltage controlled oscillator configured to generate an output signal based on the proportional path signal, the $1^{st}$ integral path signal and the $2^{nd}$ integral path signal.

2. The system of claim 1 wherein the frequency-to-current converter is further configured to divide the reference signal to generate the control signal received by the charge pump.

3. The system of claim 1 wherein the voltage controlled oscillator includes a relaxation oscillator.

4. The system of claim 1 wherein the voltage controlled oscillator includes a ring oscillator.

5. The system of claim 1 wherein the loop filter includes a first switched capacitor integrator configured to generate the $1^{st}$ integral path signal.

6. The system of claim 5 wherein the first switched capacitor integrator is further configured to generate an output signal; and
   wherein the loop filter further includes a second switched capacitor integrator configured to generate the $2^{nd}$ integral path signal based on the output signal from the first switched capacitor integrator.

7. The system of claim 6 wherein the second switched capacitor integrator is controlled using a self-setting decimation of the reference signal by a predetermined factor.

8. The system of claim 1 wherein the first output signal from the charge pump is directly proportional to a phase error between the reference signal and a divided version of the output signal from the voltage controlled oscillator.

9. The system of claim 8 wherein the second output signal from the charge pump 10 represents an integral of the phase error between the reference signal and the divided version of the output signal from the voltage controlled oscillator.

10. The system of claim 1 wherein the system is made using a CMOS logic process.

11. A phase-locked loop comprising:
    a frequency-to-current converter configured to receive a reference signal and generate a control signal;
    a charge pump configured to generate a first output signal and a second output signal based on the control signal received from the frequency-to-current converter;
    a loop filter circuit configured to receive the first and second output signals from the charge pump, the loop filter circuit including a proportional path filter, a $1^{st}$ integral path filter and a $2^{nd}$ integral path filter, wherein the proportional path filter is configured to generate a proportional path signal to set a loop bandwidth, the $1^{st}$ integral path filter is configured to generate a $1^{st}$ integral path signal to set a stabilizing zero that controls a phase margin, and the $2^{nd}$ integral path filter is configured to generate a $2^{nd}$ integral path signal to set an average voltage-controlled oscillator frequency; and
    a voltage controlled oscillator configured to generate an output signal based on the proportional path signal, the integral path signal and the 2nd integral path signal.

12. The phase-locked loop of claim 11 wherein the frequency-to-current converter is further configured to divide the reference signal to generate the control signal received by the charge pump.

13. The phase-locked loop of claim 11 wherein the voltage controlled oscillator includes a relaxation oscillator.

14. The phase-locked loop of claim 11 wherein the voltage controlled oscillator includes a ring oscillator.

15. The phase-locked loop of claim 11 wherein the integral $1^{st}$ path filter includes a first switched capacitor integrator configured to generate the $1^{st}$ integral path signal; and
wherein the $2^{nd}$ integral path filter includes a second switched capacitor integrator configured to generate the $2^{nd}$ integral path signal.

16. The phase-locked loop of claim 15 wherein the first switched capacitor integrator is further configured to generate an output signal; and
wherein the second switched capacitor integrator is further configured to generate the 2nd integral path signal based on the output signal from the first switched capacitor integrator.

17. The phase-locked loop of claim 15 wherein the second switched capacitor integrator is controlled using a self-setting decimation of the reference signal by a predetermined factor.

18. The phase-locked loop of claim 11 wherein the first output signal from the charge pump is directly proportional to a phase error between the reference signal and a divided version of the output signal from the voltage controlled oscillator.

19. The phase-locked loop of claim 18 wherein the second output signal from the 20 charge pump represents an integral of the phase error between the reference signal and the divided version of the output signal from the voltage controlled oscillator.

20. The phase-locked loop of claim 11 wherein the phase-locked loop is made using a CMOS logic process.

21. A method of implementing a phase-locked loop, comprising:
performing a frequency-to-current conversion based on a reference signal to generate a control signal;
using the control signal to direct a charge pump to generate a first output signal and a second output signal;
using the first and second output signals from the charge pump to direct a loop filter to generate a proportional path signal to set a loop bandwidth, a $1^{st}$ integral path signal to set a stabilizing zero that controls a phase margin, and a $2^{nd}$ integral path signal to set an average voltage-controlled oscillator frequency; and
using the proportional path signal, the $1^{st}$ integral path signal and the $2^{nd}$ integral path signal to direct a voltage controlled oscillator to generate an output signal.

22. The method of claim 21 wherein the control signal is generated by dividing the reference signal.

23. The method of claim 21 wherein the $2^{nd}$ integral path signal is generated by using a self-setting decimation of the reference signal by a predetermined factor.

24. The method of claim 21 wherein the first output signal from the charge pump is directly proportional to a phase error between the reference signal and a divided version of the output signal from the voltage controlled oscillator.

25. The method of claim 24 wherein the second output signal from the charge pump represents an integral of the phase error between the reference signal and the divided version of the output signal from the voltage controlled oscillator.

* * * * *

UNITED STATES PATENT AND TRADEMARK OFFICE
CERTIFICATE OF CORRECTION

PATENT NO.        : 7,634,038 B1
APPLICATION NO.   : 11/339077
DATED             : December 15, 2009
INVENTOR(S)       : Michael M. Hufford et al.

It is certified that error appears in the above-identified patent and that said Letters Patent is hereby corrected as shown below:

IN THE SPECIFICATION:

In Column 4, Line 20: Replace Equation 2 with $$\frac{K_{VF}}{M} \cong 2\pi \frac{\left[\frac{\left(1+\frac{C_{VMAX}}{C_L}\right) \cdot C_{VMAX} \cdot F_{REF}}{C_L}\right]}{\left(V_{FINEMAX} - V_{FINEMIN}\right)}$$

In Column 6, Line 23: Add --or-- between Equations 8 and 9.

IN THE CLAIMS:

In Column 9, Lines 3 and 4: Replace "integral 1st" with --1st integral--.

Signed and Sealed this

Twenty-first Day of September, 2010

David J. Kappos
*Director of the United States Patent and Trademark Office*

UNITED STATES PATENT AND TRADEMARK OFFICE
CERTIFICATE OF CORRECTION

PATENT NO.       : 7,634,038 B1                                           Page 1 of 1
APPLICATION NO.  : 11/339077
DATED            : December 15, 2009
INVENTOR(S)      : Hufford et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 997 days.

Signed and Sealed this

Ninth Day of November, 2010

David J. Kappos
*Director of the United States Patent and Trademark Office*